(12) United States Patent
Lan et al.

(10) Patent No.: US 11,106,146 B2
(45) Date of Patent: Aug. 31, 2021

(54) LITHOGRAPHY SYSTEM AND METHOD

(71) Applicant: TAIWAN SEMICONDUCTOR MANUFACTURING CO., LTD., Hsinchu (TW)

(72) Inventors: Hao-Yu Lan, Taipei (TW); Po-Chung Cheng, Chiayi County (TW); Ching-Juinn Huang, Changhua County (TW); Tzung-Chi Fu, Miaoli County (TW); Tsung-Yen Lee, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/901,506

(22) Filed: Jun. 15, 2020

(65) Prior Publication Data

US 2020/0310259 A1 Oct. 1, 2020

Related U.S. Application Data

(63) Continuation of application No. 16/516,452, filed on Jul. 19, 2019, now Pat. No. 10,684,561.

(60) Provisional application No. 62/751,724, filed on Oct. 29, 2018.

(51) Int. Cl.
*G03F 9/00* (2006.01)

(52) U.S. Cl.
CPC .................. *G03F 9/7019* (2013.01)

(58) Field of Classification Search
CPC ............... G03F 9/7019; G03F 7/70075; G03F 7/70591; G03F 1/82

USPC ......................... 355/30, 53, 55, 77
See application file for complete search history.

(56) References Cited

U.S. PATENT DOCUMENTS

| 5,789,947 A | 8/1998 | Sato |
| 9,646,374 B2* | 5/2017 | Hashimoto ............. G06T 7/001 |
| 2005/0086820 A1 | 4/2005 | Stilblert et al. |
| 2010/0205815 A1 | 8/2010 | Rinn |
| 2014/0168627 A1 | 6/2014 | Schmitt-Weaver et al. |
| 2014/0268074 A1* | 9/2014 | Chien .................. G03F 7/70741 355/30 |
| 2014/0365985 A1* | 12/2014 | Ishii .......................... G03F 1/70 716/55 |
| 2016/0042505 A1* | 2/2016 | Tsuchiya .................. G06T 7/001 382/144 |
| 2018/0293720 A1* | 10/2018 | Yoshitake ................. G03F 1/70 |
| 2019/0056674 A1 | 2/2019 | Solowan |

* cited by examiner

*Primary Examiner* — Hung Nguyen
(74) *Attorney, Agent, or Firm* — Maschoff Brennan

(57) ABSTRACT

A system is disclosed. The system includes a cleaning device and a scanner device. The cleaning device is configured to clean a mask. The scanner device is coupled to the cleaning device and is configured to receive the mask, a reference image and a real-time image that is captured at the mask. The reference image includes at least one first mark image having a plurality of mapping marks on the mask. The real-time image includes at least one second mark image having the plurality of mapping marks on the mask. The scanner device is configured to map the at least one second mark image in the real-time image with the at least one first image in the reference image, when a lithography exposing process is performed. A method is also disclosed herein.

20 Claims, 5 Drawing Sheets

LITHOGRAPHY SYSTEM AND METHOD

PRIORITY CLAIM AND CROSS-REFERENCE

The present application is a continuation of the U.S. application Ser. No. 16/516,452, filed Jul. 19, 2019, issued as U.S. Pat. No. 10,684,561 on Jun. 16, 2020, which claims priority to U.S. Provisional Application Ser. No. 62/751,724, filed Oct. 29, 2018, all of which are herein incorporated by reference.

BACKGROUND

Photolithography process is utilized for semiconductor device manufacturing. The mask used in the photolithography process carries the patterns, and the patterns are configured to be transferred to a substrate in order to form a desired structure on the substrate. In the photolithography process, the source light is generated to expose a photoresist layer on the substrate via the mask. With that process, the patterns are able to be transferred to the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
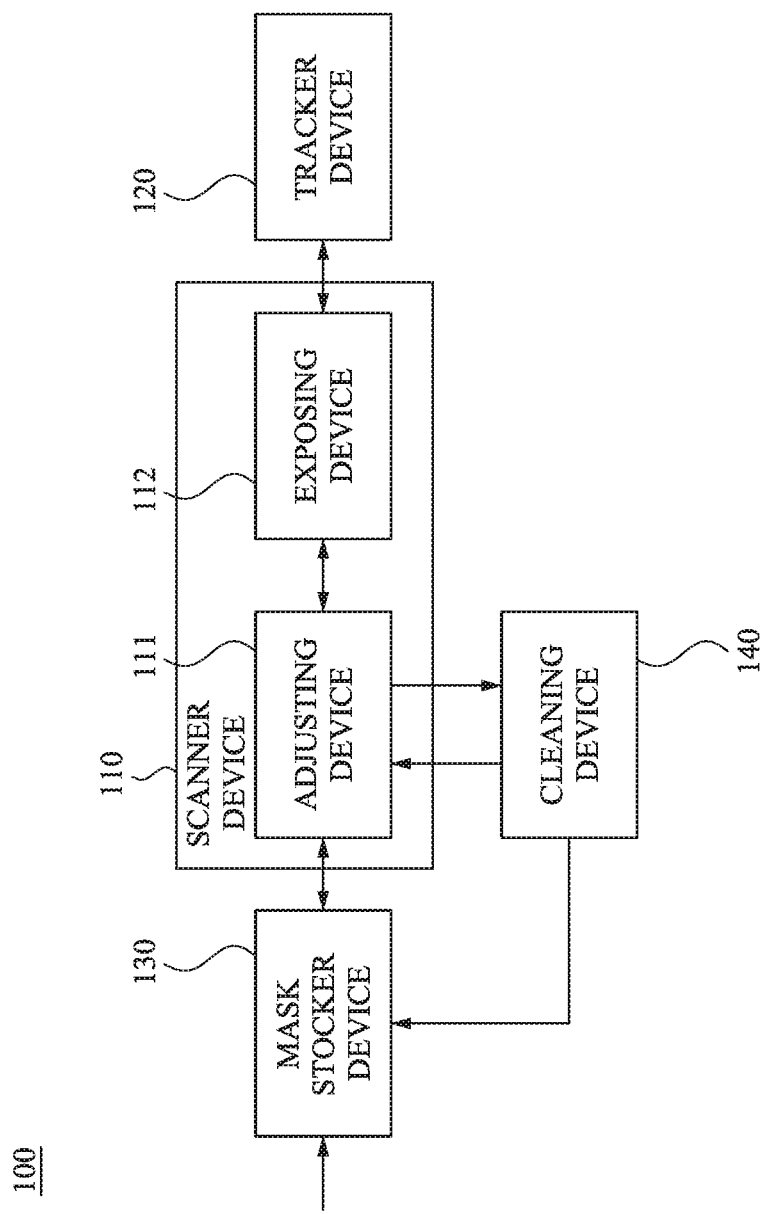
FIG. 1 is a schematic diagram of a lithography process system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Reference is now made to FIG. 1. FIG. 1 is a schematic diagram of a lithography process system 100, according to some embodiments of the present disclosure. In some embodiments, the lithography process system 100 is employed to process various semiconductor structures and/or devices with masks. In some embodiments, the lithography process system 100 is configured to perform a photolithography process with a mask on a substrate. For example, the photolithography process includes an extreme ultraviolet (EUV) exposure process. In some embodiments, the substrate is a semiconductor substrate.

In some embodiments, the lithography process system 100 includes a scanner device 110, a tracker device 120, a mask stocker device 130, and a cleaning device 140. For illustration in FIG. 1, the scanner device 110 is coupled to the mask stocker device 130. The scanner device 110 is further coupled to the tracker device 120 and the cleaning device 140. The cleaning device 140 is further coupled to the mask stocker device 130.

In some embodiments, the scanner device 110 is configured to adjust a position of the mask in the lithography process. In some other embodiments, the scanner device 110 is configured to adjust the position of the mask in several steps. For illustration, the scanner device 110 adjusts the position of the mask twice in order to achieve the accuracy of performing the photolithography process. In some alternative embodiments, the scanner device 110 is configured to adjust the position of the mask in different methods. For illustration, the scanner device 110 adjusts the position of the mask under a relatively larger scale for the first time, which is also referred to as the coarse tuning adjustment in some embodiments, and the scanner device 110 adjusts the position of the mask under a relatively smaller scale for the second time, which is also referred to as the fine tuning adjustment in some embodiments.

In some embodiments, the scanner device 110 is further configured to perform the exposing process on the substrate with the mask. In some embodiments, the scanner device 110 performs the exposing process on the substrate with the mask after the position of the mask is adjusted. Alternatively stated, the mask is moved to a pre-determined position before the exposing process is performed on the substrate.

In some embodiments, the scanner device 110 is configured to generate a source light to expose the substrate via the mask. In some embodiments, the source light has wavelengths within the visible light spectrum, invisible light spectrum, or the combination thereof. For example, the source light is an ultra violet light. For another example, the source light is an EUV light.

In some embodiments, the scanner device 110 is configured to perform the lithography process with a reflective type mask. The reflective type mask is utilized with the EUV light. The EUV light is generated and transmitted to the reflective type mask, and the EUV light reflects when the EUV light arrives at the reflective type mask. Then, the EUV light is reflected from the reflective type mask toward the substrate. In some other embodiments, the scanner device 110 is configured to perform the lithography process with a transmission type mask. When the source light is generated and transmitted to the transmission type mask, the source light is transmitted through the transmission type mask. Then, the source light is transmitted toward the substrate. The above types of the masks are given for illustrative purposes. Various types of masks are within the contemplated scope of the present disclosure.

In some embodiments, the scanner device 110 includes an adjusting device 111 and an exposing device 112. For illustration in FIG. 1, the adjusting device 111 is coupled between the mask stocker device 130 and the exposing device 112. The adjusting device 111 is further coupled to the cleaning device 140. The exposing device 112 is coupled to the tracker device 120. The configurations of the adjusting device 111 and the exposing device 112 are given for illustrative purposes. Various configurations of the adjusting device 111 and the exposing device 112 are within the contemplated scope of the present disclosure. For example, in various embodiments, the adjusting device 111 is also coupled to the tracker device 120 without being coupled through the exposing device 112.

In some embodiments, the adjusting device 111 is configured to adjust the position of the mask in the lithography process. The exposing device 112 is configured to generate the source light. The detail functions and/or operations of the adjusting device 111 and the exposing device 112 will be described below with reference to FIGS. 2-5.

In some embodiments, the tracker device 120 is configured to coat a photoresist layer on the substrate. The tracker device 120 is configured to spin-coat the photoresist layer with two different spin rates in two different steps, respectively. In some other embodiments, the tracker device 120 is configured to spin-coat the photoresist layer with single spin rate in a single step. The above methods of coating the photoresist layer on the substrate are given for illustrative purposes. Various methods of coating the photoresist layer on the substrate are within the contemplated scope of the present disclosure.

In some embodiments, the mask stocker device 130 is configured to store masks. In some embodiments, the mask is moved by a robot (not shown) of the lithography process system 100 from the mask stocker device 130 to the scanner device 110. In some embodiments, when the mask is going to be processed by the scanner device 110, the mask is transferred to a load port (not shown) from the mask stocker device 130, and the mask is further transferred by the robot to a stage (not shown). The stage is configured to hold the mask for the following processes, including, for example, exposing the source light. The following processes will be described below with reference to FIGS. 2-5.

In some embodiments, the cleaning device 140 is configured to clean the masks. In some embodiments, when the mask is determined as defective, the mask is transferred to the cleaning device 140 to be cleaned. The cleaning device 140 cleans the mask without destructing patterns on the mask. After cleaning the mask, the mask is transferred to the mask stocker device 130 to be stored. In some embodiments, the cleaning device 140 is configured to clean the mask using deionized water. In some other embodiments, the cleaning device 140 is configured to clean the mask using mild acids. The materials utilized to clean the mask, as discussed above, are given for illustrative purposes. Various materials to clean the mask are within the contemplated scope of the present disclosure.

Figure 2:
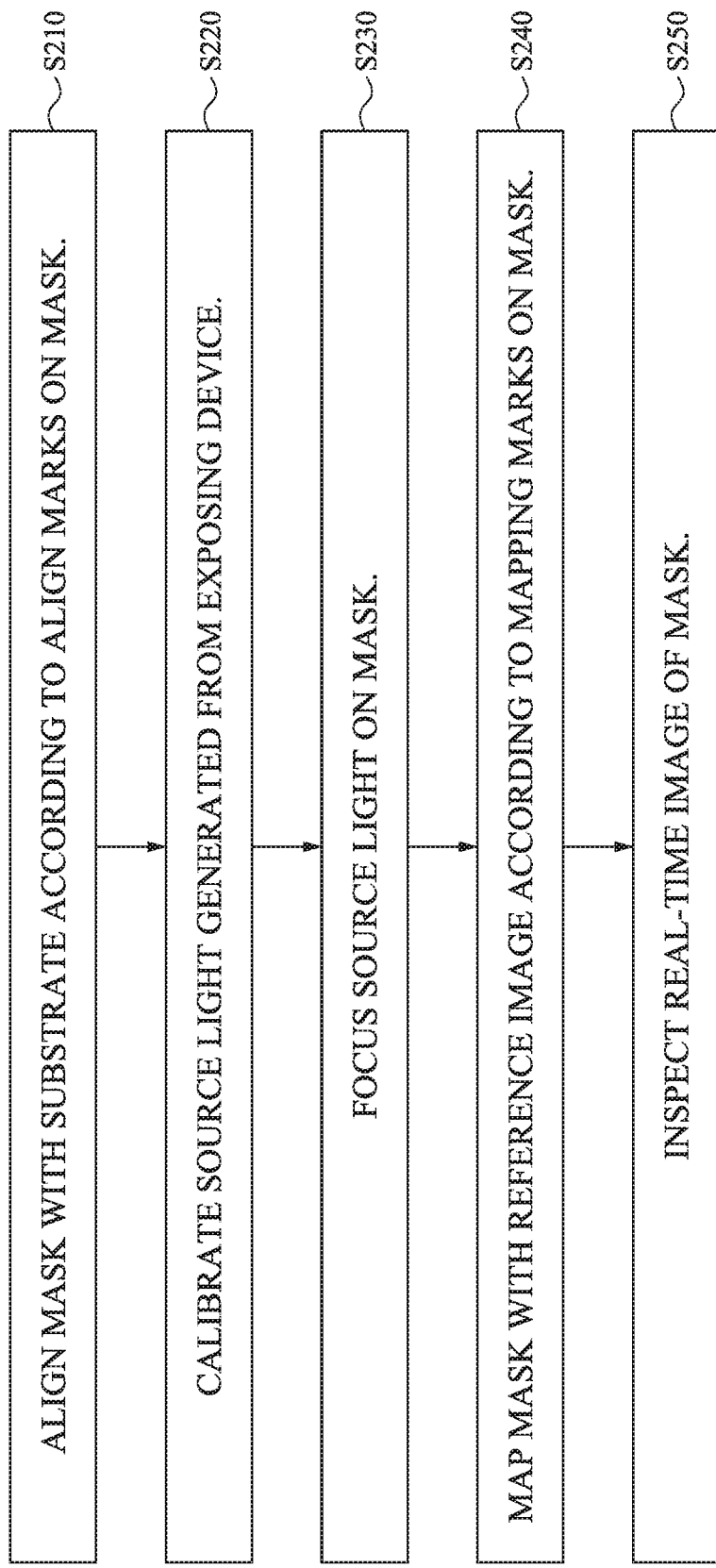
FIG. 2 is a flowchart of a method illustrating the operation the lithography process system in FIG. 1, in accordance with some embodiments.

Reference is now made to FIG. 2. FIG. 2 is a flowchart of a method 200 illustrating the operation of the lithography process system 100 in FIG. 1, according to some embodiments of the present disclosure. In some embodiments, the scanner device 110 is configured to align the mask, calibrate the source light, focus the source light, map the mask, and inspect the mask. In some embodiments, the operations of aligning, calibrating, focusing, and mapping are performed by the adjusting device 111 cooperating with the exposing device 112. For illustration in FIG. 2, the method 200 includes operations S210, S220, S230, S240, and S250.

In operation S210, the mask is aligned with the substrate according to align marks (shown in FIG. 4) on the mask. In some embodiments, the exposing device 112 is configured to generate the source light radiating the mask, and a real-time image of the mask is generated according to the source light. The real-time image of the mask includes the align marks as discussed above. The adjusting device 111 is configured to align the real-time image of the mask with the substrate according to the align marks in the real-time image. In some other embodiments, the real-time image of the mask is projected on the substrate, for the real-time image of the mask to be aligned with the substrate. The scanner device 110 is configured to align the align marks in the real-time image with align marks on the substrate.

An aligning accuracy of the alignment operation in S210 is referred to be in the range of micrometers ($\mu m$), in some embodiments. For example, the aligning accuracy of the alignment operation in S210 is about 1 $\mu m$. Alternatively stated, the resolution of alignment is about 1 $\mu m$. In some other embodiments, the aligning accuracy of the alignment operation in S210 is referred to be in about several pixels. For illustration, each pixel is in a size of about 45 nanometers (nm) in length and about 45 nm in width. Based on the above embodiments, a minimum aligning distance is in the range of from about 450 nm to about 1 $\mu m$. Therefore, when the mask has an off-set, which is more than the minimum aligning distance, from a pre-determined position, the adjusting device 111 is able to adjust the mask to be closer to the pre-determined position. In contrast to the above condition, when the mask has the off-set, which is less than the minimum aligning distance, from the pre-determined position, the adjusting device 111 determines that the mask is well aligned. The accuracy, resolution, distance, and the size of the pixel are given for illustrative purposes. Various accuracy, resolutions, distances, and the sizes of the pixels are within the contemplated scope of the present disclosure.

In operation S220, the source light generated from the exposing device 112 is calibrated. In some embodiments, the scanner device 110 is configured to calibrate the source light according to a pre-determined intensity, in which the pre-determined intensity is a reference intensity to perform the lithography process. In some other embodiments, the scanner device 110 is configured to calibrate the source light according to parameters, including, for example, a reference polarization, a reference spectrum, and a reference lasing repetition rate. In some embodiments, the operation S220 is also referred to as a shading correct operation.

In operation S230, the source light is focused on the mask. In some embodiments, the scanner device 110 is configured to focus the source light generated from the exposing device 112 on the mask, and the real-time image is generated according to the source light. Alternatively stated, the scanner device 110 controls the source light on the mask to make the real-time image have an acceptable optical resolution among the patterns on the mask. Therefore, in some embodiments, after the operation S230, the real-time image generated according to the source light from the mask has the acceptable optical resolution.

In operation S240, the mask is mapped with a reference image according to mapping marks (shown in FIG. 4) on the mask. In some embodiments, the adjusting device 111 is configured to map the mask with the reference image. In some embodiments, the reference image is acquired before the operation S240. For illustration, acquiring the reference image is performed before the operation S210. The timing of acquiring the reference image is given for illustrative purposes. Various timing of acquiring the reference image are within the contemplated scope of the present disclosure. In addition, the detail of acquiring the reference image will be described below with reference to FIG. 3.

In some embodiments, the adjusting device 111 is configured to adjust the position of the mask according to the reference image in order to move the mask closer to the pre-determined position after the mask is adjusted. In some embodiments, the exposing device 112 is configured to generate the source light irradiating the mask, and the real-time image of the mask is generated according to the source light. The real-time image of the mask includes the mapping marks. The adjusting device 111 is configured to map the real-time image of the mask with the reference image according to the mapping marks in the real-time image. The scanner device 110 is configured to map the mapping marks in the real-time image with mapping marks in the reference image.

A mapping accuracy of the mapping operation in S240 is around several pixels (for example, 3 pixels). Alternatively stated, the resolution of mapping is about 3 pixels. In some embodiments, the mapping accuracy of the mapping operation in operation S210 is around 135 nm. Alternatively stated, a minimum mapping distance is about 135 nm. Therefore, when the mask has a displacement more than the minimum mapping distance from the pre-determined position, the adjusting device 111 is able to move the mask closer to the pre-determined position. In contrast to the above condition, when the mask has the displacement less than the minimum mapping distance from the pre-determined position, the adjusting device 111 determines that the mask is well mapped. The above accuracy, resolution, and distance are given for illustrative purposes. Various accuracy, resolutions, and distances are within the contemplated scope of the present disclosure. In addition, the further detail of mapping operation will be described below with reference to FIG. 3.

In operation S250, the real-time image of the mask is inspected. The scanner device 110 is configured to inspect the real-time image of the mask being well mapped in order to determine whether the mask is defective. In some embodiments, when the mask has contaminated particles on the patterns of the mask, the real-time image is different from the reference image because images of the contaminated particles are formed in the real-time image. In some other embodiments, when the patterns of the mask are destructed, the real-time image is different from the reference image because images of the destructed patterns are formed in the real-time image. Alternatively stated, when the real-time image is different from the reference image, the scanner device 110 determines that the mask is defective. The above defective situations are given for illustrative purposes. Various defective situations are within the contemplated scope of the present disclosure.

In some embodiments, when the mask is defective, the scanner device 110 is configured to analyze the defects. In some embodiments, the scanner device 110 is further configured to generate a signal which indicates the defective situations as discussed above. Accordingly, the scanner device 110 sends the defective mask to the cleaning device 140 to be cleaned. In further embodiments, the scanner device 110 transforms an inspected defect on the mask to a signal which indicates the defective situations as discussed above, and the cleaning device 140 cleans the mask based on the signal.

In some approaches, the exposing process is performed after the mask is aligned, without mapping the mask. Therefore, the aligning accuracy is poor. The lithography process system in some approaches inspects the mask under a condition that the displacement is in a large range. Accordingly, when a size of a pattern on the mask is smaller than, for example, one micrometer, the lithography process system in some approaches is unable to determine whether the pattern is well aligned.

Compared to the above approaches, the exposing process is performed after the mask is aligned and then mapped. Therefore, the displacement between the mask and the pre-determined position is decreased down to, for example, about 135 nm. The lithography process system 100 is able to inspect the mask under a more precise condition. A scan fail rate of the mask decreases. Furthermore, the lithography process system 100 is able to distinguish whether a scan fail happens because of a defect with a size around 135 nm-1 μm or a displacement around 135 nm-1 μm. The operation of inspection is performed under a more precise condition about the position. Accordingly, the quality of the inspection is improved. Moreover, the exposing process is performed under the more precise condition, and thus the performance of the exposing process is improved. The yield rate of the exposing process increases. Consequently, the cost of lithography process decreases.

On the other hand, the mask is to be cleaned when the mask is determined as being defective. Accordingly, it is thus easier to maintain cleanliness of the mask. The cleaned mask is transferred to the mask stocker device 130 to be stored. Accordingly, the field of storing the masks is improved as well.

The above illustrations include exemplary operations, but the operations are not necessarily performed in the order shown. Operations may be added, replaced, changed order, and/or eliminated as appropriate, in accordance with the spirit and scope of various embodiments of the present disclosure.

Figure 3:
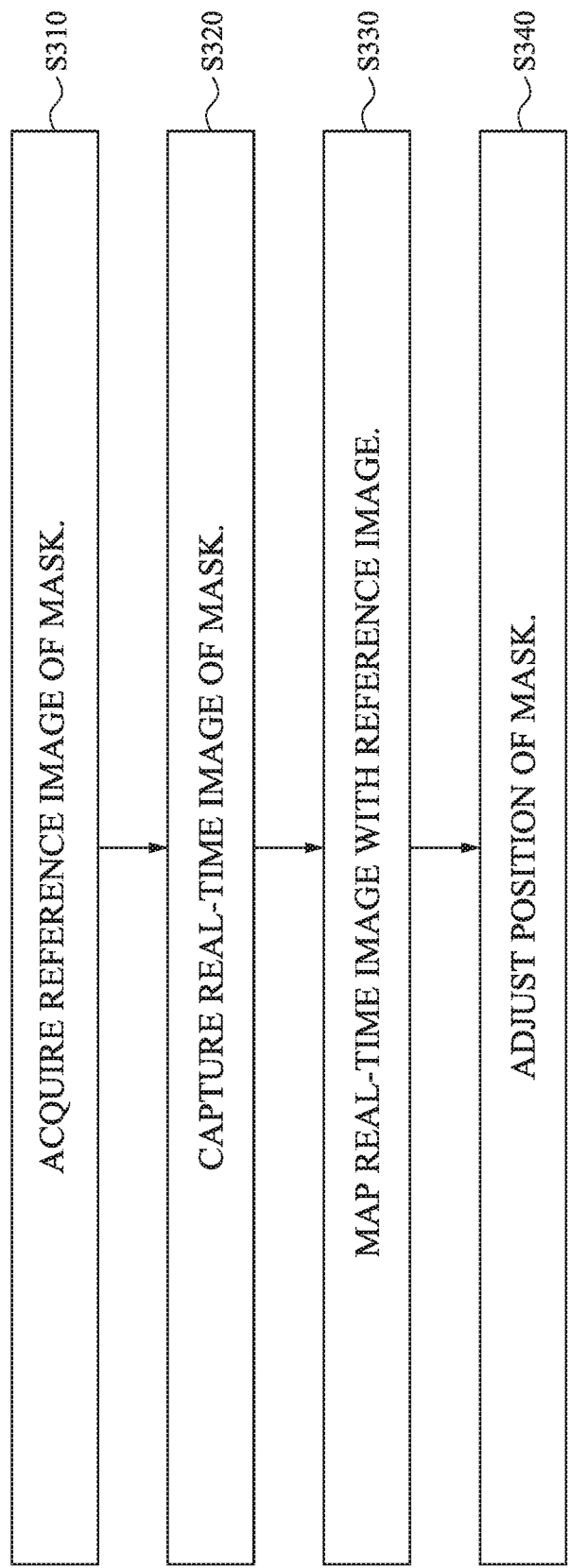
FIG. 3 is a flowchart of a method illustrating the operation of mapping the mask as discussed in FIG. 2, in accordance with some embodiments.

Reference is now made to FIG. 3. FIG. 3 is a flowchart of a method 300 illustrating the operation of mapping the mask as discussed above in FIG. 2, according to some embodiments of the present disclosure. For illustration in FIG. 3, the method 300 includes operations S310, S320, S330, and S340.

In operation S310, the reference image of the mask is acquired. In some embodiments, the lithography process system 100 is configured to acquire the reference image of the mask. The mask includes the align marks and the mapping marks. In some embodiments, the reference image is acquired by capturing the mapping marks as separate images respectively, and then combining the separate images to build the reference image. The reference image also includes images of the patterns on the mask. Each one of the separate images includes the image of at least one of the mapping marks, and each mapping marks is captured for at least one time. For example, when the mask includes 16 mapping marks, the lithography process system 100 captures 16 separate images in which each includes one mapping mark. Next, the 16 separate images are tailored to build the reference image of the mask. In some embodiments, the reference image of the mask is not acquired by the lithography process system 100 but another device, including, for example, a camera independent and separate from the lithography process system 100.

In some embodiments, the reference image is acquired when the mask is clean and is not destructed in any part of patterns on the mask. Alternatively stated, when the reference image is acquired, the mask is free of defects. Therefore, in some embodiments, the reference image represents an image of mask in a flawless condition. The reference image is also referred to as "Golden image" in some embodiments.

In some embodiments, the operation S310 further includes decoding the separate images as data. The data is stored in a memory device (not shown). In some embodiments, the memory device is a part of the lithography process system 100. In some other embodiments, the memory device is a device independent of the lithography process system 100.

In some embodiments, the operation S310 further includes re-decoding the data as the separate images. After the data stored in the memory device is re-decoded as separate images, the lithography process system 100 is configured to build the reference image based on the separate images.

In some embodiments, because the separate images are stored in the memory device, a time duration between capturing separate images and mapping the mask varies in different scenarios. Alternatively stated, once the operation of capturing the separate images is performed before mapping the mask, the lithography process system 100 is able to acquire the reference image.

In operation S320, the real-time image of the mask is captured. In some embodiments, the scanner device 110 is configured to capture the real-time image of the mask. The mask includes the align marks and the mapping marks. The real-time image of the mask is captured by reflecting the source light at the mask to generate the real-time image which includes images of the patterns and every mapping marks.

In operation S330, the real-time image is mapped with the reference image. In some embodiments, the adjusting device 111 is configured to map mapping marks on the reference image with mapping marks on the real-time image, respectively. In some embodiments, when the reference image and the real-time image have the displacement therebetween, the mapping marks on the reference image are not overlapped with the mapping marks on the real-time image. The adjusting device 111 is configured to calculate the displacement by mapping the real-time image with the reference image.

In operation S340, the position of the mask is adjusted. In some embodiments, the adjusting device 111 is configured to adjust the position of the mask according to the displacement after the mapping operation. In some embodiments, the mask is positioned closer to the pre-determined position after the adjusting operation. In some embodiments, the mask is located at the pre-determined position after the adjusting operation. In some other embodiment, the displacement between the reference image and the real-time image decreases after the adjusting operation. In some alternative embodiments, the displacement between the reference image and the real-time image is smaller than about 135 nm after the adjusting operation.

The above illustrations include exemplary operations, but the operations are not necessarily performed in the order shown. Operations may be added, replaced, changed order, and/or eliminated as appropriate, in accordance with the spirit and scope of various embodiments of the present disclosure. For example, in some other embodiments, the operation S310 is performed before the mask is transferred into the scanner device 110. For another example, in some alternative embodiments, the operation of decoding and re-decoding can be omitted.

Figure 4:
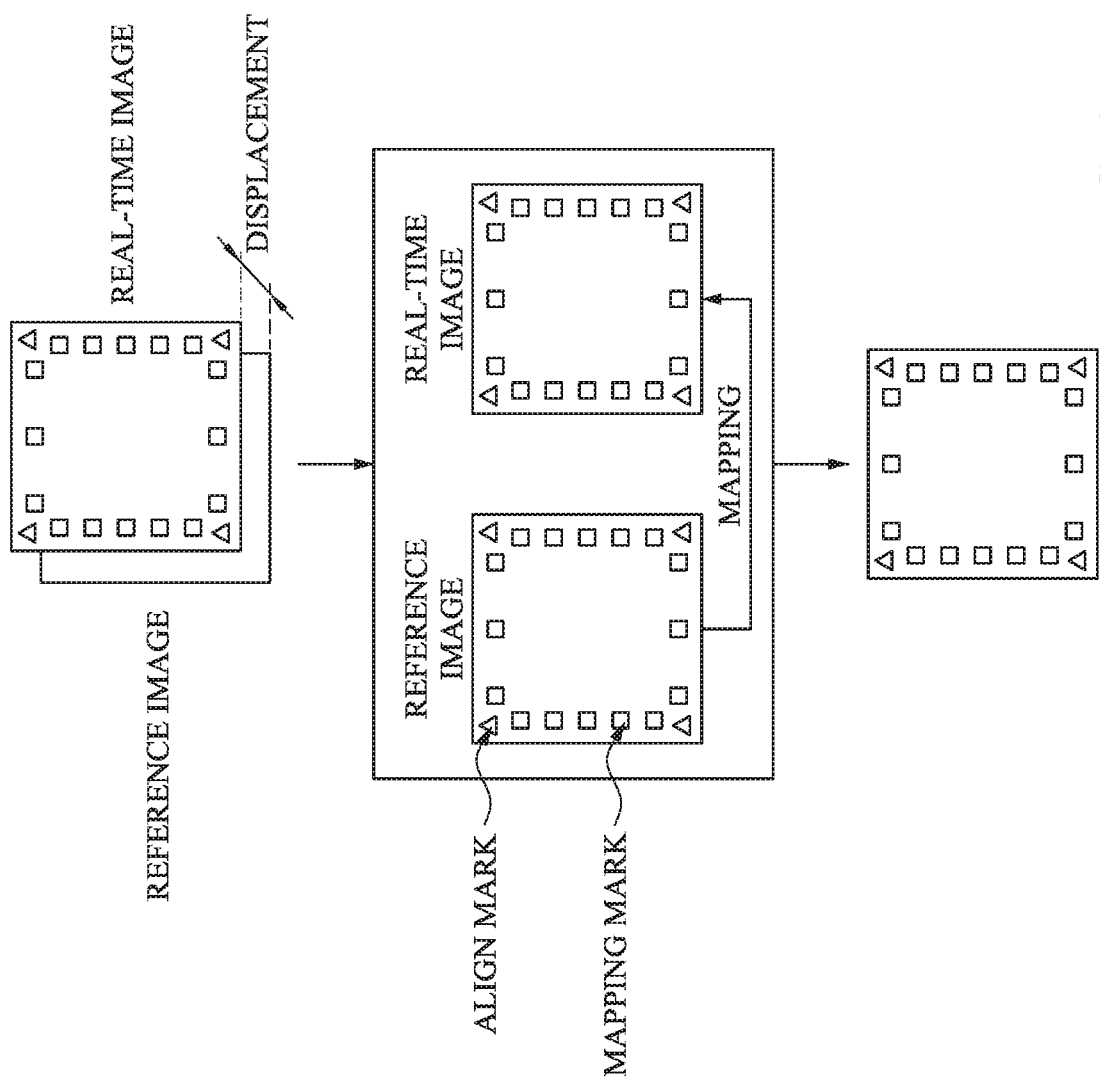
FIG. 4 is a schematic diagram of operating mapping the mask in FIG. 3, in accordance with some embodiments.

Reference is now made to FIG. 4. FIG. 4 is a schematic diagram of mapping the mask in FIG. 3, according to some embodiments of the present disclosure. For illustration in FIG. 4, the reference image and the real-time image have the displacement therebetween before mapping the mask. The adjusting device 111 maps the mapping marks on the real-time image with the mapping mark on the reference image, respectively. The adjusting device 111 calculates the displacement and then adjusts the position of the mask based on the calculated displacement.

The mapping marks are disposed on each side of patterns on the mask. In some embodiments, the mapping marks are disposed on each edge of the mask. In some embodiments, the mapping marks are evenly disposed rounding the patterns on the mask. For illustration in FIG. 4, 16 mapping marks are disposed on edges of the reference image and the real-time image, and 4 align marks are disposed at the corners of the reference image and the real-time image. In some embodiments, when the number of mapping marks increases, the accuracy of mapping the mask increases. The above number, shape, and arrangement of the mapping masks and the align marks are given for illustrative purposes. Various numbers, shapes, and arrangements of the mapping masks and the align marks are within the contemplated scope of the present disclosure.

For illustration in FIG. 4, the reference image and the real-time image are overlapped without the displacement therebetween after the mask is mapped. In some embodiments, the displacement still exists after the mask is mapped. The displacement decreases and is smaller than the mapping accuracy. The displacement in FIG. 4 is given for illustrative purposes. Various displacements are within the contemplated scope of the present disclosure. For example, in some embodiments, the real-time image is located at the upper left corner with respect to the reference image, and the displacement exists in different direction compared to the displacement shown in FIG. 4.

Figure 5:
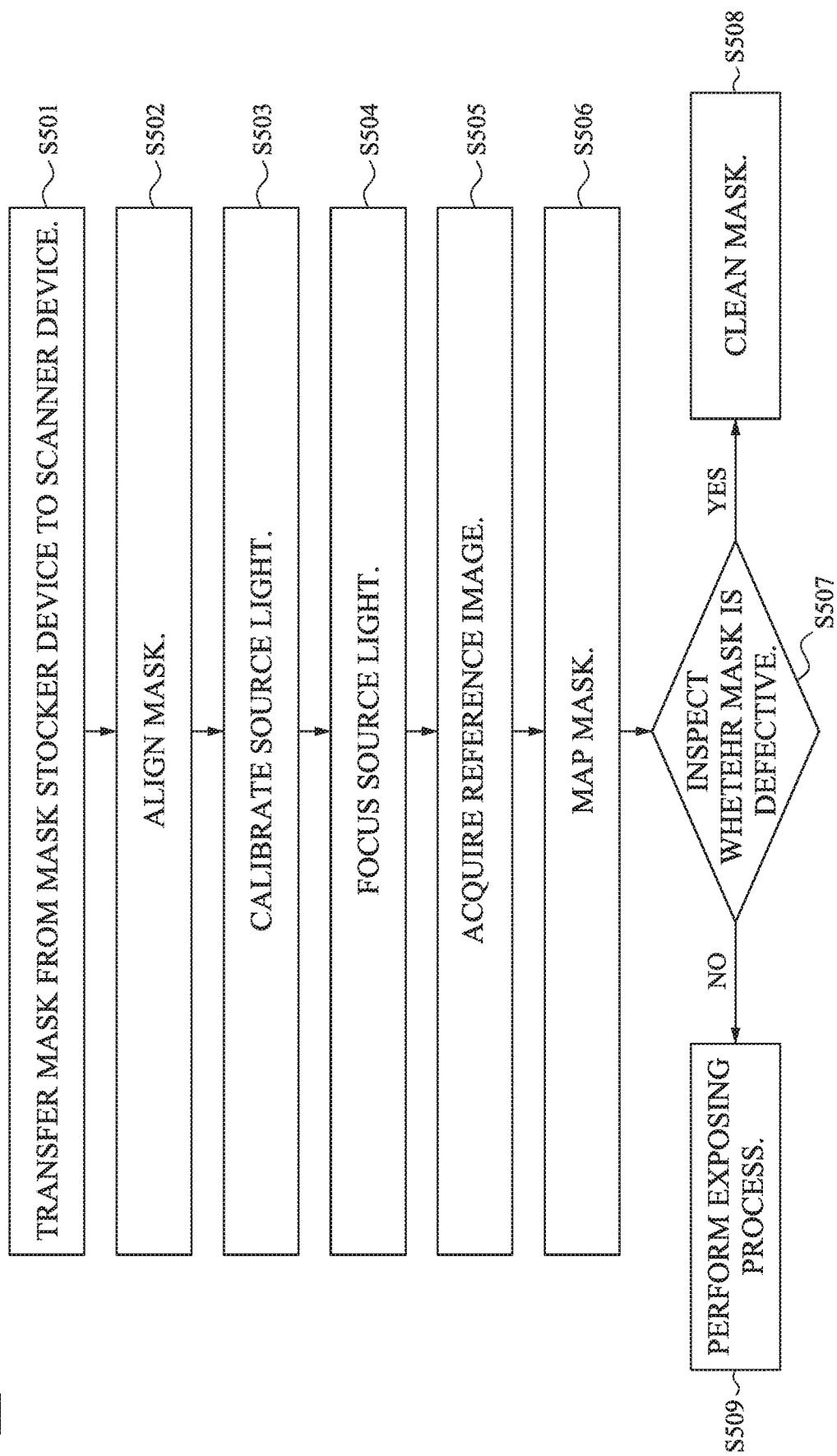
FIG. 5 is a flowchart of method illustrating the operation of the lithography process in FIGS. 1-4, in accordance with some embodiments.

Reference is now made to FIG. 5. FIG. 5 is a flowchart of method 500 illustrating the operation of the lithography process in FIGS. 1-4, according to some embodiments of the present disclosure. The method includes operations S501, S502, S503, S504, S505, S506, S507, and S508. In operation S501, the mask is transferred from the mask stocker device 130 to scanner device 110. In some embodiments, the mask is transferred from the mask stocker device 130 to the load port, and then is further transferred to the stage. The mask is held by the stage for the following operations.

In some embodiments, the mask is transferred by the robot. The robot is configured to grab the mask on the sides without touching the surface of the mask where the patterns are located. Then, the robot is configured to flip the mask and put the mask on the stage. The operations of robot are given for illustrative purposes. Various operations of the robot are within the contemplated scope of the present disclosure.

In operation S502, the mask is aligned. The source light is generated from the exposing device 112 toward the mask, and the mask is aligned by the adjusting device 111 according to the source light. For example, the source light reflects at the mask and form an image on the substrate, and then the adjusting device 111 aligns the align marks on the image with the substrate. In some embodiments, the alignment operation is also referred to as "pre-adjusting."

In operation S503, the source light is calibrated. In some embodiments, the intensity of the source light is calibrated to the pre-determined intensity. In some embodiments, other parameters of the source light are also calibrated to the desired range. For example, the parameters include the polarization of the source light.

In operation S504, the source light is focused. The scanner device 110 is configured to focus the source light at the mask in order to generate the real-time image with acceptable resolution.

In operation S505, the reference image is acquired. The operation of acquiring the reference image is similar to the operation S310 in FIG. 3. The description about acquiring the reference image will not repeat here again.

In operation S506, the mask is mapped. The operation of mapping the mask is similar to the operations S320, S330, and S340 in FIG. 3. The description about mapping the mask will not repeat here again.

In operation S507, the mask is inspected. The operation of inspecting is similar to the operation S250 in FIG. 2. The real-time image of the mask is inspected to determine whether the mask is defective. When the mask is defective, the operation S508 will be performed. When the mask is clean, the operation S509 will be performed.

In operation S508, the mask is cleaned. When the mask is defective, the mask is transferred to the cleaning device 140 to be cleaned. In some embodiments, after cleaning the mask, the mask is transferred back to the mask stocker device 130 to be stored.

In operation S509, the exposing process is performed. When the mask is clean, the exposing process is performed with the mask to form the patterns of the mask on the substrate.

The above illustrations include exemplary operations, but the operations are not necessarily performed in the order shown. Operations may be added, replaced, changed order, and/or eliminated as appropriate, in accordance with the spirit and scope of various embodiments of the present disclosure.

In some embodiments, a system is disclosed. The system includes a cleaning device and a scanner device. The cleaning device is configured to clean a mask. The scanner device is coupled to the cleaning device and is configured to receive the mask, a reference image and a real-time image that is captured at the mask. The reference image includes at least one first mark image having a plurality of mapping marks on the mask, and the real-time image includes at least one second mark image having the plurality of mapping marks on the mask. The scanner device is configured to map the at least one second mark image in the real-time image with the at least one first mark image in the reference image, when a lithography exposing process is performed.

In some embodiments, when the lithography exposing process is performed, the scanner device is further configured to calculate a displacement between the reference image and the real-time image, after mapping the real-time image with the reference image, and configured to adjust a position of the mask according to the displacement.

In some embodiments, when the lithography exposing process is performed, the scanner device is further configured to decode data that are transformed from the reference image to retrieve the reference image.

In some embodiments, the scanner device is further configured to determine whether the mask is defective based on a mapping result that is associated with the real-time image and the reference image.

In some embodiments, the scanner device is further configured to generate a defective signal when the mask is defective, and the cleaning device is further configured to clean the mask based on the defective signal.

In some embodiments, the system further includes a mask stocker device. The mask stocker device is coupled to the scanner device and the cleaning device. The mask stocker device is configured to store the mask, and to transfer the mask to the scanner device.

Also disclosed is a system. The system includes a mask stocker device and a scanner device. The mask stocker device is configured to store a mask. The scanner device is coupled to the mask stocker device and is configured to access the mask, a reference image and a real-time image. The reference image includes a plurality of separate images on the mask, and the real-time image includes a plurality of mapping marks on the mask. In a lithography process operation, the scanner device is configured to perform a mapping operation by mapping the real-time image with the reference image, and to perform an adjusting operation on the mask based on a result of the mapping operation.

In some embodiments, the plurality of separate images of the reference image are captured by a camera, and each of the plurality of separate images of the reference image comprises at least one of the plurality of mapping marks on the mask. The plurality of mapping marks in the real-time image is mapped with the at least one of the plurality of mapping marks in the reference image, in the mapping operation.

In some embodiments, the scanner device is further configured to calculate a displacement between the reference image and the real-time image, based on the result of the mapping operation.

In some embodiments, the system further includes a cleaning device. The cleaning device is coupled to the mask stocker device and the scanner device. The cleaning device is configured to clean the mask based on a defective signal send from the scanner device. The defective signal is generated by the scanner device after performing the adjusting operation.

In some embodiments, the system further includes a tracker device. The tracker device is coupled to the scanner device. The tracker device is configured to coat a photoresist layer on a substrate to be performed in the lithography process operation.

In some embodiments, in the lithography process operation, the scanner device is further configured to align the mask with at least one align mark on the mask. A minimum mapping scale is smaller than a minimum aligning scale.

In some embodiments, the scanner device is further configured to perform an inspection operation by inspecting the mask after performing the adjusting operation, to determine whether the mask is defective.

In some embodiments, when the mask is determined to be defective in the inspection operation, the scanner device is further configured to generate a defective signal to a clean device, to clean the mask which is defective.

In some embodiments, the scanner device includes an adjusting device and an exposing device. The adjusting device is configured to align the real-time image with a substrate, based on a plurality of align marks in the real-time image. The exposing device is coupled to the adjusting device and is configured to generate a source light. The source light is configured to radiate the mask to generate the real-time image.

Also disclosed is a method includes the following operations. A real-time image of a mask is captured, based on a source light focused on the mask. The mask includes a plurality of mapping marks and a plurality of align marks. A reference image of the mask is acquired, based on first images captured from the plurality of mapping marks of the mask. Second images of the real-time image are mapped with the first images of the reference image in a lithography process. The first images and the second images have at least one of the plurality of mapping marks.

In some embodiments, the method further includes the following operations. The mask is aligned with the plurality of align marks. A minimum mapping scale of the operation of the operation of mapping is smaller than a minimum aligning scale of the operation of aligning.

In some embodiments, the method further includes the following operations. A displacement between the real-time image and the reference image is calculated. A position of the mask is adjusted based on the displacement and a minimum mapping distance that is pre-determined.

In some embodiments, the operation of acquiring the reference image of the mask includes the following operations. The first images are combined to build the reference image. Each of the plurality of mapping marks is captured for at least one time.

In some embodiments, the method further includes the following operations. A position of the mask is aligned with a substrate in the lithography process. An offset between the reference image and the real-time image is adjusted, based on a result of the operation of mapping the real-time image with the reference image.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system, comprising:
    a mask stocker device configured to store a mask; and
    a scanner device coupled to the mask stocker device and configured to access the mask, a reference image and a real-time image,
    wherein the reference image comprises a plurality of separate images on the mask, and the real-time image comprises a plurality of mapping marks on the mask,
    wherein in a lithography process operation, the scanner device is configured to perform a mapping operation by mapping the real-time image with the reference image, and to perform an adjusting operation, based on a result of the mapping operation, on the mask to have a displacement between the reference image and the real-time image that is less than a minimum mapping distance.

2. The system of claim 1, wherein the plurality of separate images of the reference image are captured by a camera, and each of the plurality of separate images of the reference image comprises at least one of the plurality of mapping marks on the mask,
    wherein the plurality of mapping marks in the real-time image is mapped with the at least one of the plurality of mapping marks in the reference image, in the mapping operation.

3. The system of claim 1, wherein the scanner device is further configured to calculate the displacement between the reference image and the real-time image, based on the result of the mapping operation.

4. The system of claim 1, further comprising:
    a cleaning device coupled to the mask stocker device and the scanner device, wherein the cleaning device is configured to clean the mask based on a defective signal send from the scanner device,
    wherein the defective signal is generated by the scanner device after performing the adjusting operation.

5. The system of claim 1, further comprising:
    a tracker device coupled to the scanner device, wherein the tracker device is configured to coat a photoresist layer on a substrate to be performed in the lithography process operation.

6. The system of claim 1, wherein in the lithography process operation, the scanner device is further configured to align the mask with at least one align mark on the mask, wherein a minimum mapping scale is smaller than a minimum aligning scale.

7. The system of claim 1, wherein the scanner device is further configured to perform an inspection operation by inspecting the mask after performing the adjusting operation, to determine whether the mask is defective.

8. The system of claim 7, wherein when the mask is determined to be defective in the inspection operation, the scanner device is further configured to generate a defective signal to a clean device, to clean the mask which is defective.

9. The system of claim 1, wherein the scanner device comprises:
    an adjusting device configured to align the real-time image with a substrate, based on a plurality of align marks in the real-time image; and
    an exposing device coupled to the adjusting device and configured to generate a source light, wherein the source light is configured to radiate the mask to generate the real-time image.

10. A system, comprising:
    a scanner device configured to receive a mask from a mask stocker device, a reference image and a real-time image, and comprising:

an exposing device configured to generate a source light for generating the real-time image; and an adjusting device coupled to the exposing device, and configured to map at least one mark image in the real-time image with at least one mark image in the reference image, to adjust a position of the mask to have a displacement between the reference image and the real-time image that is less than a minimum mapping distance in a lithography exposing process.

11. The system of claim 10, wherein the at least one mark image in the real-time image comprises a plurality of mapping marks on the mask, and the at least one mark image in the reference image comprises at least one of the plurality of mapping marks, to be mapped with the plurality of mapping marks in the real-time image.

12. The system of claim 10, wherein the adjusting device is configured to calculate the displacement between the reference image and the real-time image, after mapping the real-time image with the reference image, to adjust the position of the mask.

13. The system of claim 10, wherein the scanner device is further configured to inspect the real-time image mapped with the reference image, to determine whether the mask is defective.

14. The system of claim 10, wherein the adjusting device is further coupled to a tracker device without being coupled through the exposing device.

15. The system of claim 10, wherein the adjusting device is further configured to align the mask based on the source light.

16. A system, comprising:

a mask stocker device configured to store a mask; and a scanner device configured to access the mask transferred from the mask stocker device, a reference image having a plurality of marks on the mask and a real-time image having the plurality of marks on the mask, wherein the scanner device is further configured to map the plurality of marks in the real-time image with the plurality of marks in the reference image, to adjust a position of the mask to have a displacement between the reference image and the real-time image that is less than a minimum mapping distance when a lithography process is performed.

17. The system of claim 16, wherein the scanner device is further configured to adjust the position of the mask based on the displacement between the reference image and the real-time image, after mapping the real-time image with the reference image.

18. The system of claim 16, wherein the plurality of marks in the reference image are built by combining a plurality of separate images, and each of the plurality of separate images comprises at least one of the plurality of marks.

19. The system of claim 18, wherein the scanner device is further configured to decode the plurality of separate images as data, and to re-decode the data as the plurality of separate images.

20. The system of claim 16, wherein the scanner device is further configured to send the mask to a cleaning device to be cleaned, when the mask is defective determined by the scanner device.

* * * * *